United States Patent
So et al.

(10) Patent No.: US 12,185,569 B2
(45) Date of Patent: Dec. 31, 2024

(54) LIGHT EMITTING DEVICE AND ASSOCIATED METHODS

(71) Applicants: Nextgen Nano Limited, London (GB); North Carolina State University, Raleigh, NC (US)

(72) Inventors: Franky So, Cary, NC (US); Qi Dong, Raleigh, NC (US); Liping Zhu, Raleigh, NC (US); Matthew Stone, London (GB)

(73) Assignees: Nextgen Nano Limited, London (GB); North Carolina State University, Raleigh, NC (US)

( * ) Notice: Subject to any disclaimer, the term of this patent is extended or adjusted under 35 U.S.C. 154(b) by 152 days.

(21) Appl. No.: 17/535,279

(22) Filed: Nov. 24, 2021

(65) Prior Publication Data
US 2023/0165042 A1    May 25, 2023

(51) Int. Cl.
*H10K 50/85* (2023.01)
*G02B 5/00* (2006.01)
*H10K 71/00* (2023.01)

(52) U.S. Cl.
CPC ............. *H10K 50/85* (2023.02); *G02B 5/008* (2013.01); *H10K 71/00* (2023.02)

(58) Field of Classification Search
CPC ......... H10K 71/00; H10K 50/85; G02B 5/008
See application file for complete search history.

(56) References Cited

U.S. PATENT DOCUMENTS

| | | | |
|---|---|---|---|
| 2005/0224779 A1* | 10/2005 | Wang | H01J 1/304 257/E29.094 |
| 2007/0246094 A1 | 10/2007 | Brabec et al. | |
| 2007/0272296 A1 | 11/2007 | Brabec et al. | |
| 2011/0068676 A1* | 3/2011 | Jeon | H01L 33/50 313/483 |
| 2011/0195201 A1* | 8/2011 | Zhu | H01Q 21/0087 204/192.12 |
| 2012/0050732 A1* | 3/2012 | Lu | B82Y 40/00 427/205 |
| 2014/0339518 A1 | 11/2014 | Yamamoto | |

(Continued)

FOREIGN PATENT DOCUMENTS

| | | |
|---|---|---|
| WO | 2014007867 A1 | 1/2014 |
| WO | 2018068720 A1 | 4/2018 |
| WO | 2019072163 A1 | 4/2019 |

OTHER PUBLICATIONS

EPO, Extended European Search Report for European Patent Application No. EP 20 83 9800 dated Jul. 3, 2023, 7 Pages.

(Continued)

*Primary Examiner* — Jonathan Y Jung
(74) *Attorney, Agent, or Firm* — NK Patent Law

(57) ABSTRACT

The present disclosure relates to a method of forming an antenna layer for use in a light emitting device, the method comprising providing a plurality of particles on a support layer so that a space is formed between at least two particles of the plurality of particles, depositing a material so that at least a portion of the material passes through the space between the at least two particles on to the support layer and removing the plurality of particles from the support layer, the portion of the material remaining on the support layer to form at least a part of the antenna layer.

19 Claims, 5 Drawing Sheets

(56) References Cited

U.S. PATENT DOCUMENTS

| | | |
|---|---|---|
| 2015/0064837 A1 | 3/2015 | Forrest et al. |
| 2015/0107674 A1 | 4/2015 | Lee et al. |
| 2017/0031183 A1* | 2/2017 | Han ..................... G02F 1/0121 |
| 2017/0207405 A1 | 7/2017 | Lescouet et al. |
| 2020/0295093 A1* | 9/2020 | Thompson ............. H10K 50/19 |
| 2021/0359026 A1* | 11/2021 | Thompson ............. H10K 59/32 |

OTHER PUBLICATIONS

Fusella, Michael A., at al. "Plasmonic enhancement of stability and brightness in organic light-emitting devices." Nature, vol. 585, Sep. 17, 2020, 379-382.

\* cited by examiner

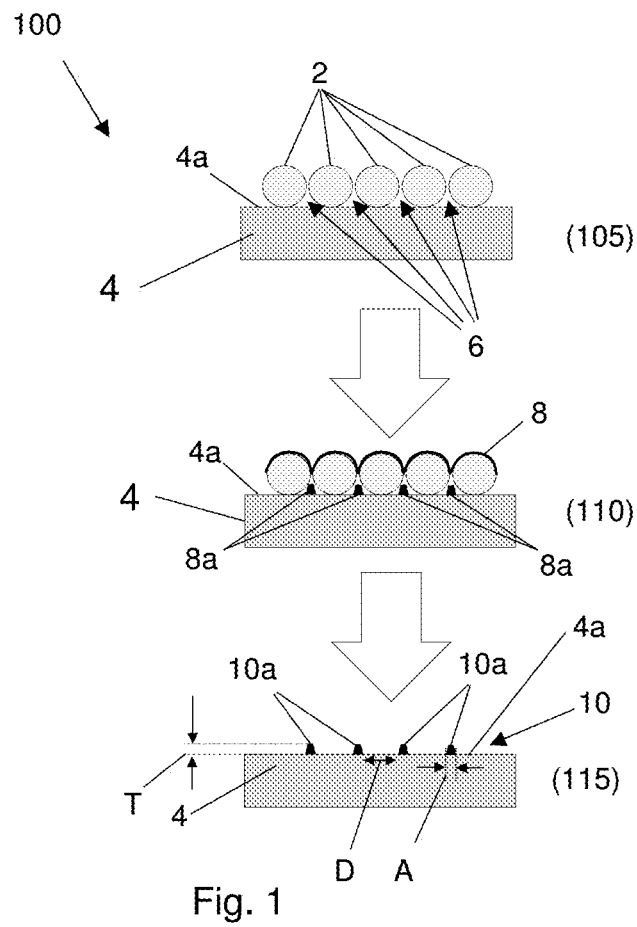
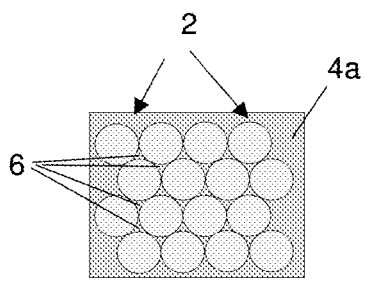
Fig. 2
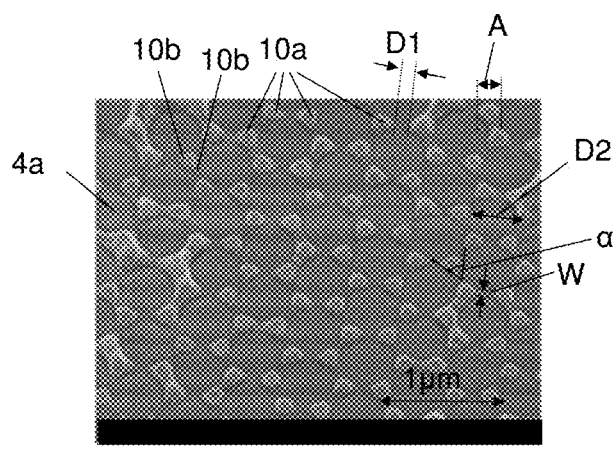
Fig. 3

LIGHT EMITTING DEVICE AND ASSOCIATED METHODS

FIELD

The present disclosure relates a light emitting device and associated methods.

BACKGROUND

The use of organic light emitting diodes (OLEDs) in mass-scale commercial products may be desirable due to their properties, such as good colour saturation, versatile form factor and low-power consumptions. For example, blue light emitting OLEDs may be used amongst others in solid-state lighting and/or displays. However, for example, in blue phosphorescent OLEDs, the slow decay rate of triplet excitons, which may be in the order of $\mu s^{-1}$, may limit the lifetime of the OLEDs and/or lead to fast device degradation. This degradation can be more severe for blue emitters compared to, for example, green and red emitters due larger the bandgap and higher energy required to create an excited state. Therefore, it may be desirable to improve the efficiency and stability of such OLEDs.

This background serves only to set a scene to allow a person skilled in the art to better appreciate the following description. Therefore, none of the above discussion should necessarily be taken as an acknowledgement that that discussion is part of the state of the art or is common general knowledge. One or more aspects/embodiments of the disclosure may or may not address one or more of the background issues.

SUMMARY

According to a first aspect of the present disclosure there is provided a method of forming an antenna layer for use in a light emitting device, the method comprising providing a plurality of particles on a support layer so that a space is formed between at least two particles of the plurality of particles, depositing a material so that at least a portion of the material passes through the space between the at least two particles on to the support layer, and removing the plurality of particles from the support layer, the portion of the material remaining on the support layer to form at least a part of the antenna layer.

The method may allow for facile and/or precise control or adjustment of one or more parameters of the antenna layer. For example, when the antenna layer is used in the light emitting device, the antenna layer may be configured to confine one or more surface plasmons and/or to generate a localised surface plasmon (LSP) mode. For example, the LSP mode may be generated when the antenna layer is irradiated with photons emitted by the light emitting device. By controlling the one or more parameters of the antenna layer, the confinement of one or more surface plasmons in antenna layer and/or the generation of the LSP mode may be controlled. Additionally or alternatively, by controlling the one or more parameters of the antenna layer, one or more LSP resonances, e.g. a resonant wavelength of the LSP mode, may be adjusted and/or varied. This may allow for an improved interaction or resonance between a surface plasmon polariton (SPP) mode, which may propagate in the light emitting device, and the LSP mode, e.g. to out-couple and/or extract energy from the SPP mode. The energy extracted and/or out-coupled from the SPP mode may be provided in the form of photons. The improved interaction or resonance between the LSP and SPP modes may lead to an increase in performance and/or stability of the light emitting device.

Additionally or alternatively, the method may allow for the antenna layer to be formed as part of an internal structure of the light emitting device. This may facilitate the use of the light emitting device in a display and/or solid-state lighting. The method may also be integrated in a process or method of forming the light emitting device, e.g. without any significant changes to the process or method.

The support layer may be part of, comprised in or usable in the light emitting device. Expressed differently, the light emitting device may comprise one or more layers. At least one of the one or more layers of the light emitting device may define or comprise at least part or all of the support layer.

The step of providing the plurality of particles may comprise arranging the plurality of particles on the support layer.

The step of depositing the material may comprise depositing the material on the plurality of particles, e.g. so that at least the portion of the material passes through the space between the at least two particles on the support layer.

The step of providing the plurality of particles on the support layer may comprise providing or arranging the plurality of particles on the support layer, e.g. so that a plurality of spaces may be formed. At least one or each space of the plurality of spaces may be formed between at least two particles of the plurality of particles. At least one or each space of the plurality of spaces may be formed between at least two neighbouring or adjacent particles of the plurality of particles.

The step of depositing the material may comprise depositing the material, e.g. so that at least a portion of the material may pass through at least one, some or all of the plurality of spaces on to support layer. A portion of the material may pass through each space of the plurality of spaces.

The method may comprise removing the plurality of particles from the support layer. A plurality of portions of the material may remain on the support layer, e.g. to form the antenna layer.

The step of providing the plurality particles on the support layer may comprise providing or arranging the plurality of particles on the support layer to form a periodic or quasiperiodic arrangement or array of particles. The step of providing the plurality of particles on the support layer may comprise providing or arranging the plurality of particles on the support layer to form a close-packed arrangement or array of particles. The closed-packed arrangement or array of particles may comprise a hexagonal closed-packed array or arrangement of particles.

The method may comprise selecting one or more properties of the plurality of particles, e.g. to adjust or control the one or more parameters of the antenna layer, e.g. prior to arranging the plurality of particles on the support layer. The one or more properties of the plurality of particles may comprise at least one of: a size or diameter of at least one or each particle of the plurality of particles and a shape of at least one or each particle of the plurality of particles. The one or more properties of the plurality of particles may be selected based on a wavelength of photons emitted by the light emitting device.

The antenna layer may comprise a plurality of antenna portions. The one or more parameters of the antenna layer may comprise a periodicity of the plurality of antenna portions, a height or thickness of at least one or each antenna portion of the plurality of antenna portions, a lateral extension of at least one or each antenna portion of the plurality of antenna portions, a distance between at least two antenna portions of the plurality of antenna portions and/or a shape of at least one or each antenna portion of the plurality of antenna portions.

The distance between the at least two antenna portion may vary in a lateral direction. The distance between the at least two antenna portions may comprise a first distance. The first distance may comprise a distance between at least two adjacent or neighbouring antenna portions. The first distance may be defined between at least two opposing antenna portions, e.g. which may be formed or arranged closest to each other. The first distance may comprise a minimal distance between the at least two opposing antenna portions.

The distance between the at least two antenna portions may comprise a second distance. The second distance may be defined between at least two opposing antenna portions, e.g. which may be formed or arranged furthest from each other. The second distance may comprise a maximum distance between the at least two opposing antenna portions. The second distance may be determined by the size or diameter of at least one or each particle of the plurality of particles. The at least two opposing antenna portions may be considered as opposing one other in the lateral direction.

The plurality of antenna portions, e.g. some or all of the plurality of antenna portions, may be uniform, e.g. substantially uniform, in at least one of: the shape, the lateral extension and the thickness or height. For example, some or all of the plurality of antenna portions, may comprise the same, e.g. substantially the same, shape, lateral extension and/or thickness or height. The distance between the at least two antenna portions of the plurality of antenna portions may be uniform and/or the same, e.g. substantially uniform and/or the same.

The antenna layer may comprise or define a resonant wavelength. At the resonant wavelength, optical absorption of photons emitted by the light emitting device may be increased or maximised in the antenna layer, e.g. the plurality of antenna portions. The resonant wavelength of the antenna layer may be same or substantially the same as the wavelength of photons emitted by the light emitting device. The resonant wavelength of the antenna layer may be or comprise the resonant wavelength the LSP mode. The resonant wavelength of the antenna layer, e.g. the LSP mode, may be varied, controlled or adjusted based on the one or more parameters of the antenna layer.

The one or more parameters of the antenna layer may be controlled or selected based on the wavelength of photons emitted by the light emitting device. For example, at least one of the lateral extension of at least one or each antenna portion of the plurality of antenna portions, the thickness or height of at least one or each antenna portion of the plurality of antenna portions and the distance between the at least two antenna portions of the plurality of antenna portions may be controlled or selected based on the wavelength of photons emitted by the light emitting device.

The lateral extension of at least one or each antenna portion of the plurality of antenna portions may be about 100 nm or less. The first distance may be about 20 nm or less. For example, the first distance may be in the range of about 5 nm to 20 nm. The second distance may be about 300 nm or less.

At least one or each antenna portion of the plurality of antenna portions may comprise one or more end portions. The one or more end portions may comprise or define one or more pointed, tapered or sharp ends (or end portions). For example, at least one or each of the one or more pointed, tapered or sharp ends of the at least one or each antenna portion of the plurality of antenna portions may define an angle of about 60 degrees. A width of the at least one or each of the one or more pointed, tapered or sharp ends may be in the region of about 2 nm to 20 nm. By forming the at least one or each antenna portion of the plurality of antenna portions with one or more pointed, tapered or sharp ends, one or more electric fields near the antenna layer, e.g. the antenna portions, may be enhanced. For example, an increase in sharpness or decrease in the angle of the at least one or each of the one or more pointed, tapered or sharp ends of the at least one or each antenna portion of the plurality of antenna portions may result in an enhancement of the one or more electric fields near the antenna layer, e.g. the antenna portions.

In some embodiments, at least one or each antenna portion of the plurality of antenna portions may comprise a pyramidal or truncated pyramidal shape. A footprint of at least one or each antenna portion of the plurality of antenna portions may be or comprise a triangular shape, e.g. substantially triangular shape. In other embodiments, at least one or each antenna portion of the plurality of antenna portions may comprise a cylindrical shape, truncated cone shape or the like, and/or a footprint of at least one or each antenna portion may be or comprise a circular shape, e.g. substantially circular shape, or the like.

The thickness or height of at least one or each antenna portion of the plurality of antenna portions may be in the range of about 10 nm to 150 nm.

The step of providing the plurality of particles on the support layer may comprise using a colloidal assembly method, such as the Langmuir-Blodgett assembly method. The step of providing the plurality of particles on the support layer may comprise at least one of: transferring, depositing or providing the plurality of particles on a precursor substrate, causing the plurality of particles to form a periodic or quasiperiodic array or other arrangement of particles on the precursor substrate, removing the array or other arrangement of particles from the precursor substrate, and transferring the array or other arrangement of particles on to the support layer.

The plurality of particles may be deposited, transferred or provided on the precursor substrate in a random, arbitrary or irregular arrangement.

According to a second aspect of the present disclosure there is provided an antenna layer for use in light emitting device, wherein the antenna layer is formed using the method according to the first aspect.

According to a third aspect of the present disclosure there is provided a light emitting device comprising a first electrode and a second electrode, an emissive layer arranged or formed between the first and second electrodes, the emissive layer being configured to emit photons when a voltage is applied to the first and second electrodes, a support layer, and an antenna layer, wherein the antenna layer is formed or arranged in proximity to at least one of the first and second electrodes and between the support layer and at least one other of the first and second electrodes.

By arranging or forming the antenna layer in proximity to the at least one of the first and second electrodes, coupling of energy, e.g. in the form of photons, to the SPP mode may be facilitated and/or increased, e.g. in use. This may allow for a decrease in the triplet concentration, which in turn may result in an increased lifetime of the light emitting device.

The antenna layer may be configured to confine the one or more surface plasmons and/or to generate the LSP mode. For example, the LSP mode may be generated when the antenna layer is irradiated with photons emitted by the light emitting device. The arrangement or formation of the antenna layer in proximity to the at least one of the first and second electrode may also allow for an improved interaction or resonance between the SPP mode and the LSP mode, e.g. to out-couple and/or extract energy from the SPP mode. The improved interaction or resonance between the LSP and SPP modes may lead to an increase in performance and/or stability of the light emitting device.

Additionally or alternatively, the arrangement or formation of the antenna layer between the support layer and the at least one other of the first and second electrodes may allow for the use of the light emitting device in solid-state lighting and/or in a display. Expressed differently, the antenna layer may be part of an internal structure of the light emitting device, which may facilitate the incorporation of the light emitting device in solid-state lighting and/or in a display.

The antenna layer may be formed using the method according to the first aspect.

The antenna layer may be arranged or formed at a distance from the at least one of the first and second electrodes. The distance between the antenna layer and the at least one of the first and second electrodes may be selected to allow for increased interaction between the LSP and SPP modes. The distance between the antenna layer and the at least one of the first and second electrodes may be selected to allow for increased out-coupling of energy from the SPP mode. For example, the distance between the antenna layer and the at least one of the first and second electrodes may be in the range of about 10 nm to 40 nm, such as about 20 nm. The light emitting device may comprise at least one other layer. The at least one other layer may be arranged or formed adjacent to the antenna layer and/or the at least one of the first and second electrodes. For example, the at least one other layer may be formed or arranged between the antenna layer and the at least one of the first and second electrodes. In some embodiments, the at least one other layer may be formed or arranged on the antenna layer, e.g. directly on the antenna layer. In some embodiments, the antenna layer may be formed or arranged on, e.g. formed or arranged indirectly on, the at least one of the first and second electrode.

The antenna layer may comprise a plurality of antenna portions. The plurality of antenna portions may form a periodic or quasiperiodic arrangement or array of antenna portions. For example, the plurality of antenna portions may define or form a hexagonal array or arrangement of antenna portions. The periodic or quasiperiodic arrangement or array of antenna portions may result in an increased out-coupling or extraction of energy from the light emitting device, e.g. the SPP mode. This may lead to an increased efficiency or performance of the light emitting device.

The antenna layer may comprise one or more properties. The one or more parameters of the antenna layer may comprise a periodicity of the plurality of antenna portions, a height or thickness of at least one or each antenna portion of the plurality of antenna portions, a lateral extension of at least one or each antenna portion of the plurality of antenna portions, a distance between at least two antenna portions of the plurality of antenna portions and/or a shape of at least one or each antenna portion of the plurality of antenna portions.

The distance between the at least two antenna portions may vary in a lateral direction. The distance between at least two antenna portions may comprise a first distance. The first distance may comprise a distance between at least two adjacent or neighbouring antenna portions. The first distance may be defined between at least two opposing antenna portions, e.g. which may be formed or arranged closest to each other. The first distance may comprise a minimal distance between the at least two opposing antenna portions.

The distance between the at least two antenna portions may comprise a second distance. The second distance may be defined between at least two opposing antenna portions, e.g. which may be formed or arranged furthest from each other. The second distance may comprise a maximum distance between the at least two opposing antenna portions. The at least two opposing antenna portions may be considered as opposing each other in the lateral direction.

The plurality of antenna portions, e.g. some or all of the plurality of antenna portions, may be uniform, e.g. substantially uniform, in at least one of: the shape, the lateral extension and the thickness or height. For example, some or all of the plurality of antenna portions may comprise the same, e.g. substantially the same, shape, lateral extension and/or thickness or height. The distance between the at least two antenna portions of the plurality of antenna portions may be uniform and/or the same, e.g. substantially uniform and/or the same.

The antenna layer may comprise or define a resonant wavelength. At the resonant wavelength, optical absorption of photons emitted by the light emitting device may be increased or maximised in the antenna layer, e.g. the plurality of antenna portions. The resonant wavelength of the antenna layer may be same or substantially the same as the wavelength of photons emitted by the light emitting device. The resonant wavelength of the antenna layer may be or comprise the resonant wavelength the LSP mode. The resonant wavelength of the antenna layer, e.g. the LSP mode, may be varied, controlled or adjusted based on the one or more parameters of the antenna layer.

The one or more parameters of the antenna layer may be selected based on the wavelength of photons emitted by the light emitting device. For example, at least one of the lateral extension of at least one or each antenna portion of the plurality of antenna portions, the thickness or height of at least one or each antenna portion of the plurality of antenna portions and the distance between the at least two antenna portions of the plurality of antenna portions may be selected based on the wavelength of photons emitted by the light emitting device.

The lateral extension of at least one or each antenna portion of the plurality of antenna portions may be about 100 nm or less. The first distance may be about 20 nm or less. For example, the first distance may be in the range of about 5 nm to 20 nm. The second distance may be about 300 nm or less.

At least one or each antenna portion of the plurality of antenna portions may comprise one or more end portions. The one or more end portions may comprise or define one or more pointed, tapered or sharp ends (or end portions). For example, at least one or each of the one or more pointed, tapered or sharp ends of at least one or each antenna portion of the plurality of antenna portions may define an angle of about 60 degrees. A width of the at least one or each of the one or more pointed, tapered or sharp end may be in the region of about 2 nm to 20 nm. By forming the at least one or each antenna portion with one or more pointed, tapered or sharp ends, one or more electric fields near the antenna layer, e.g. the antenna portions, may be enhanced. For example, an increase in sharpness or decrease in the angle of the at least one or each of the one or more pointed, tapered or sharp ends of the at least one or each antenna portion of the plurality of antenna portions may result in an enhancement of the one or more electric fields near the antenna layer, e.g. the antenna portions.

At least one or each antenna portion of the plurality of antenna portions may comprise a pyramidal or truncated pyramidal shape. A footprint of at least one or each antenna portion of the plurality of antenna portions may be or comprise a triangular shape, e.g. substantially triangular. Alternatively, at least one or each antenna portion of the plurality of antenna portions may comprise a cylindrical shape, truncated cone shape or the like, and/or a footprint of at least one or each antenna portion may be or comprise a circular shape, e.g. substantially circular shape, or the like.

The thickness or height of at least one or each antenna portion of the plurality of antenna portions may be in the range of about 10 nm to 150 nm.

The periodic or quasiperiodic array or arrangement of antenna portions may comprise or define a pitch in the range of about 100 nm to 1000 nm. The pitch may be or comprise the distance between the at least two antenna portions of the plurality of antenna portions. For example, the pitch may comprise the second distance, e.g. the maximum distance between the at least two opposing antenna portions of the plurality of antenna portions.

The light emitting device may comprise a corrugated structure. The corrugated structure may be due to or caused by the plurality of antenna portions. The corrugated structure may comprise a plurality of grooves. The corrugated structure may comprise a plurality of ridges or peaks. The pitch may be or comprise a distance between at least two ridges or peaks of the plurality of ridges or peaks. Expressed differently, the pitch may define or comprise a peak-to-peak distance of the corrugated structure. The peak-to-peak distance may be the same as the second distance.

The light emitting device may comprise at least one of: a charge transport layer, a charge injection layer, and a charge blocking layer. The at least one of the charge transport layer, charge injection layer and the charge blocking layer may be arranged or formed between the emissive layer and the at least one of the first and second electrodes. Additionally or alternatively, the at least one of the charge transport layer, charge injection layer and the charge blocking layer may be arranged or formed between the emissive layer and the at least one other of the first and second electrodes.

A thickness of the at least one: the of charge transport layer, charge injection layer and the charge blocking layer may be selected to allow for coupling of photons from the emissive layer to one or more SPP modes at the at least one of the first and second electrodes. The thickness of the at least one: the of charge transport layer, charge injection layer and the charge blocking layer may be selected to allow for extraction of photons from the light emitting device. For example, the thickness of the at least one: the of charge transport layer, charge injection layer and the charge blocking layer may be selected to allow for coupling of photons from the emissive layer to an air mode of the light emitting device.

The light emitting device may comprise a further emissive layer configured to emit photons, e.g. when a voltage is applied to the first and second electrodes. The emissive layer may be configured to emit photons having a first wavelength. The further emissive layer may be configured to emit photos having a second wavelength. The first wavelength may be different from the second wavelength.

The light emitting device may comprise at least one of: a substrate and an insulating layer. The support layer may be part of, comprised in or defined by at least one of: the substrate, the insulating layer and the at least one of the first and second electrodes. The insulating layer may be arranged or formed between at least one of: the substrate and the antenna layer, and the antenna layer and the at least one of the first and second electrodes. In some embodiments, the at least one of the first and second electrodes may be arranged or formed between the antenna layer and the substrate. In such embodiments, the at least one other layer may comprise the insulating layer.

The light emitting device may comprise a dielectric layer. In some embodiments, the antenna layer may be formed or arranged between the substrate and the dielectric layer. In such embodiments, the at least one other layer may comprise the dielectric layer.

According to a fourth aspect of the present disclosure there is provided a method of forming a light emitting device, the method comprising forming or providing a support layer, forming an antenna layer, forming a first electrode in proximity to the antenna layer, forming an emissive layer, and forming a second electrode, wherein the antenna layer is formed or arranged between the support layer and the second electrode, and wherein the emissive layer is arranged or formed between the first and second electrodes and configured to emit light when a voltage is applied to the first and second electrodes.

The step of forming the antenna layer may comprise using one or more steps of the method according to the first aspect.

According to a fifth aspect of the present disclosure there is provided a light emitting device, wherein the light emitting device is formed using the method according to the fourth aspect.

Features, benefits, or advantages associated with particular examples or embodiments relating to any one described aspect may equally relate to any other one or more described aspects.

Further elements of the aspects described may include one or more examples, embodiments or features in isolation or in various combinations whether or not specifically stated (including claimed) in that combination or in isolation.

BRIEF DESCRIPTION OF THE DRAWINGS

These and other aspects of the present disclosure will now be described, by way of example only, with reference to the accompanying figures, in which:

FIG. 1 depicts an exemplary process flow of a method of forming an antenna layer for use in a light emitting device;

FIG. 2 depicts a schematic top view of a plurality of particles on a surface of a support layer;

FIG. 3 depicts a scanning electron microscope image of an antenna layer formed using the method of FIG. 1;

DETAILED DESCRIPTION

Figure 4:
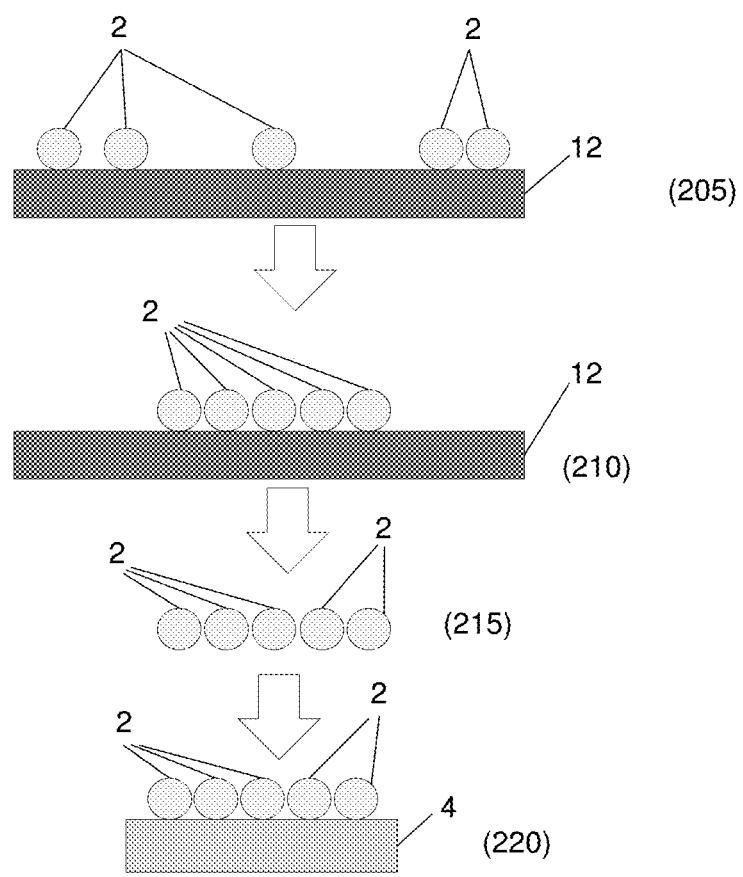
FIG. 4 depicts an exemplary process flow of an assembly method, which may be comprised in the method of FIG. 1.

The foregoing summary, as well as the following detailed description of certain embodiments will be better understood when read in conjunction with the accompanying drawings. As will be appreciated, like reference characters are used to refer to like elements throughout the description and drawings. As used herein, an element or feature recited in the singular and preceded by the word "a" or "an" should be understood as not necessarily excluding a plural of the elements or features. Further, references to "one example" or "one embodiment" are not intended to be interpreted as excluding the existence of additional examples or embodiments that also incorporate the recited elements or features of that one example or one embodiment. Moreover, unless explicitly stated to the contrary, examples or embodiments "comprising", "having" or "including" an element or feature or a plurality of elements or features having a particular property might further include additional elements or features not having that particular property. Also, it will be appreciated that the terms "comprises", "has" and "includes" mean "including but not limited to" and the terms "comprising", "having" and "including" have equivalent meanings.

As used herein, the term "and/or" can include any and all combinations of one or more of the associated listed elements or features.

It will be understood that when an element or feature is referred to as being "on", "attached" to, "connected" to, "coupled" with, "contacting", etc. another element or feature, that element or feature can be directly on, attached to, connected to, coupled with or contacting the other element or feature or intervening elements may also be present. In contrast, when an element or feature is referred to as being, for example, "directly on", "directly attached" to, "directly connected" to, "directly coupled" with or "directly contacting" another element of feature, there are no intervening elements or features present.

It will be understood that spatially relative terms, such as "under", "below", "lower", "over", "above", "upper", "front", "back" and the like, may be used herein for ease of describing the relationship of an element or feature to another element or feature as depicted in the figures. The spatially relative terms can however, encompass different orientations in use or operation in addition to the orientation depicted in the figures.

Reference herein to "example" means that one or more feature, structure, element, component, characteristic and/or operational step described in connection with the example is included in at least one embodiment and or implementation of the subject matter according to the present disclosure. Thus, the phrases "an example," "another example," and similar language throughout the present disclosure may, but do not necessarily, refer to the same example. Further, the subject matter characterizing any one example may, but does not necessarily, include the subject matter characterizing any other example.

Reference herein to "configured" denotes an actual state of configuration that fundamentally ties the element or feature to the physical characteristics of the element or feature preceding the phrase "configured to".

Unless otherwise indicated, the terms "first," "second," etc. are used herein merely as labels, and are not intended to impose ordinal, positional, or hierarchical requirements on the items to which these terms refer. Moreover, reference to a "second" item does not require or preclude the existence of lower-numbered item (e.g., a "first" item) and/or a higher-numbered item (e.g., a "third" item).

As used herein, the terms "approximately" and "about" represent an amount close to the stated amount that still performs the desired function or achieves the desired result. For example, the terms "approximately" and "about" may refer to an amount that is within less than 10% of, within less than 5% of, within less than 1% of, within less than 0.1% of, or within less than 0.01% of the stated amount.

The terms "light" and "photons" may be interchangeably used in the following description. The term "energy" may be understood as encompassing the terms "energy in the form of photons." The terms "triplet", "triplet state" and "triplet exciton" may be interchangeably used.

The following description relates to a light emitting device and associated methods. The light emitting device may be provided in the form of a light emitting diode (LED), such as an organic light emitting diode (OLED) or a polymer light emitting diode. It will be appreciated that in other embodiments the light emitting device may comprise a quantum dot light emitting diode, an inorganic semiconductor light emitting diode, a light emitting diode comprising perovskite material, a single photon emitter, other thin-film light emitting diode or the like.

For example in OLEDs, the electroluminescent process involves a recombination of charge carriers, such electron and holes, to generate energy in the form of photons. Initially, the charge carriers may generate singlet excited and triplet excited states. Triplet states may have a slow decay rate, e.g. in the order of $\mu s^{-1}$, which can lead to a high triplet concentration, strong triplet-triplet annihilation and/or triplet-polaron annihilation. The triplet decay rate may be increased by increasing the local density of states of a light emitting device. The Purcell factor may be used to describe this effect. The Purcell factor relates to the enhancement of a quantum system's spontaneous emission rate. In light emitting devices, such as OLEDs, the Purcell factor may be increased when a high local density of states (LDOS) is confined in a small mode volume, e.g. either in a cavity (e.g. a microcavity) or through plasmonic effects. The cavity may have little impact on the on the LDOS and the Purcell factor, which may be lower than 1.5. However, plasmonic effects may result in an increased Purcell factor and/or lead to an increased triplet decay rate. For example, according to simulations and/or theoretical predictions, an increase of the Purcell factor to about 2.8 may be possible.

The internal structure of a light emitting device, such as an OLED, may act as a waveguide, which may lead to energy in the form of photons propagating in a number of different propagation modes, e.g. in use. Such waveguides modes may include a transverse electric (TE) waveguide mode and a transverse magnetic (TM) waveguide mode. Energy propagating out of the structure (waveguide) may be referred to as propagating in an air mode. Energy propagating or formed at a metal-dielectric interface of the OLED may include energy, e.g. surface energy, propagating in a plasmon polariton (SPP) mode. The plasmonic effect may include the coupling of triplet energy to the SPP mode. Typically, the coupling of exciton energy to the SPP mode is avoided, as the exciton energy rapidly dissipates as heat. In an attempt to minimise this loss, a distance between an emissive layer and one or more electrodes of the OLED may be increased. However, by coupling the triplet energy to the SPP modes, the triplet decay rate may be increased, while the triplet concentration may be decreased. This may lead to fewer triplet-triplet annihilation, triplet-polaron annihilation processes and/or a decrease in the triplet concentration, which may lead to an increase in the lifetime of the OLED.

It may be necessary to out-couple or extract the energy coupled to the SPP, e.g. in order to increase an efficiency and performance, e.g. the Purcell factor, of the OLED. In other words, energy may be extracted or out-coupled from the SPP mode into the air mode of the OLED. A localised surface plasmon (LPS) mode may be used to interact with the SPP mode, e.g. to out-couple or extract energy from the SPP mode. A localised surface plasmon may be understood as the result of confinement of a surface plasmon in a structure having a size comparable or smaller than a wavelength of the photons used to excite the surface plasmon. For example, the wavelength of the photons used to excite the surface plasmon and/or to generate the LSP mode may comprise a wavelength of the photons emitted by the OLED. SPP have a continuous dispersion relation and exist over a wide range of frequencies, whereby LSP resonances only exist over a narrow frequency range, e.g. due their confinement in the structure. The spectral position of this resonance may be determined by size and shape of the structure.

It will be appreciated that the use of the plasmonic effects is not limited to the use in OLEDs. For example, in other embodiments, the plasmonic effect may be used in other light emitting devices, such as quantum dot light emitting diodes, an inorganic semiconductor light emitting diodes, light emitting diodes comprising perovskite material, single photon emitters, other thin-film light emitting diodes or the like. Expressed differently, one or more aspects or embodiments of the present disclosure may find applicability or be used in any light emitting device where, for example, an (increased) extraction or out-coupling of photons, e.g. from a SPP mode, may be desired.

FIG. 1 shows an exemplary process flow of a method 100 of forming an antenna layer for use in a light emitting device.

In step 105, the method 100 comprises arranging or providing a plurality of particles 2 on a support layer 4, e.g. a surface 4a thereof. The support layer 4 may be part of or comprised in the light emitting device, as will be described below. The particles 2 are arranged or provided on the support layer 4 so that a space 6 is formed or present between at least two of the particles 2. The space 6 may be formed between two adjacent or neighbouring particles 2. A plurality of spaces 6 may be formed. Each space 6 may be formed between the two particles 2. The spaces 6 may also be referred to as interstitial sites. In other words, each space 6 may define an area or part of the support layer 4 that is uncovered, e.g. by the particles 2.

In step 110, the method 100 comprises depositing a material 8 so that a portion a portion 8a of the material passes through some or all of the spaces 6 on to the support layer 4, as shown in FIG. 1. In other words, the portion 8a of the material 8 may be deposited in the spaces 6 on the support layer 4. The material 8 may be deposited on the particles 2. For example, a layer of the material 8 may be deposited on a portion, such as an upper portion, of the particles 2. Expressed differently, a surface or part, e.g. a top part or surface, of each particle 2 may be at least partially covered by the material 8. The material 8 may comprise a material that is suitable for use in the antenna layer and/or as an antenna. For example, the material may be an electrically conductive material. The material may comprise a metal, such as aluminium (Al), copper (Cu) or tungsten (W) or the like, or a transition metal, such as silver (Ag), gold (Au) or the like. The material 8 may be deposited using an evaporation or deposition process, such as electron-beam physical vapour deposition or thermal evaporation or the like.

In step 115, the method comprises removing the particles 2 from the support layer 4, e.g. so that a plurality of portions 8a of the material 8 remains on the support layer 4. The particles 2 may be removed from the support layer 4 by using a sonication process or method, e.g. in a fluid, such as an aqueous fluid or solution. In other words, the particles 2 may act as a mask on the surface 4a of the support layer 4. The portions 8a of the material may form at least a part or all of the antenna layer 10. In the following description, the portions 8a of the material 8 will be referred to as antenna portions 10a. The antenna layer 10 may comprise or define a patch antenna or a nano-patch antenna.

The method 100 described herein may allow for facile and/or precise control or adjustment of one or more parameters of the antenna layer 10. The one or more parameters of the antenna layer 10 may include a periodicity of the antenna portions 10a, height or thickness T of each antenna portion 10a, a lateral extension A of each antenna portion 10a, a distance D between at least two antenna portions 10a and/or a shape of each antenna portion 10a. The antenna layer 10 may be configured for use in the light emitting device. By including the antenna layer in a light emitting device, such as an OLED, the performance of the light emitting device may be improved. For example, in use, the antenna layer 10, e.g. one or more antenna portions 10a, may be configured to generate the LSP mode. The LSP mode may be generated when the antenna layer 10 is irradiated with photons emitted by the light emitting device. For example, in use, the antenna layer 10, e.g. one or more antenna portions 10a may be configured to confine the one or more surface plasmons. The surface plasmons may be confined in the antenna portions, between two adjacent antenna portions and/or between the antenna layer and an electrode of the light emitting device, which may be arranged or formed proximate to the antenna layer.

By controlling the one or more parameters of the antenna layer 10, the confinement of one or more surface plasmons in antenna layer and/or the generation of the LSP mode may be controlled. Additionally or alternatively, by controlling the one or more parameters of the antenna layer, one or more LSP resonances, e.g. a resonant wavelength of the LSP mode, may be adjusted and/or varied. This may allow for an improved interaction or resonance between the SPP mode and the LSP mode, e.g. to out-couple and/or extract energy from the SPP mode, e.g. into the air mode of the light emitting device. Additionally or alternatively, the method 100 described herein may be integrated in the process or method of forming a light emitting device, e.g. without any significant changes to the process or method.

The method 100 may comprise selecting one or more properties of the particles 2, e.g. to control one or more parameters of the antenna layer 10, e.g. prior to arranging the particles 2 on the support layer 4. The one or more properties of the particles 2 may be selected based on a wavelength of photons emitted by the light emitting device. The one or more properties of the particles 2 may comprise a size, e.g. a diameter, and/or a shape of the particles 2. For example, the periodicity of the antenna portions 10a on the support layer 4 may be controlled and/or adjusted by varying the size, e.g. the diameter, of the particles 2. The periodicity of the antenna portions 10a may be understood as the periodicity of the arrangement or array of antenna portions 10a on the support layer 4, which will be described below in more detail. In this embodiment, the particles 2 are in the provided in the form of spheres, having a diameter of about 300 nm. It will be appreciated that in other embodiments, the particles may comprise a different shape and/or different diameter or size. The lateral extension A, geometry and/or shape of the antenna portions 10a may be controlled and/or adjusted, for example, by varying the shape of the particles 2. The shape, diameter and/or size of the particles 2 may be varied using an etching process or method, such as plasma etching or oxygen-plasma etching. The particles 2 may comprise a polymer material, such as polystyrene.

The thickness T of the antenna portions 10a may be controlled and/or adjusted by one or more parameters of the evaporation or deposition process. The one or more parameters of the evaporation or deposition process may comprise an evaporation rate and/or a deposition time. The evaporation rate and/or the deposition time may control a deposition rate. For example, a deposition rate in the range of about 0.3 to 2 Angstrom per second (Å/s), such as about 1 Angstrom per second (Å/s), may be used to deposit the material 8 on the particles 2. This relatively low deposition rate may allow for an increased quality and/or uniformity of the antenna portions 10a. A thickness T of each antenna portion 10a may be in the range of about 10 nm to half of the diameter of the particles 2. As described above, in some embodiments, each particles 2 may have a diameter of about 300 nm. As such, the thickness T of each antenna portion 10a may be in the range of about 10 nm to 150 nm. It will be appreciated that in other embodiments, the thickness of the antenna portions may be selected to be different, based on the wavelength of photons emitted by the light emitting device.

The one or more parameters of the antenna layer may be controlled or selected based on the wavelength of photons emitted by the light emitting device. For example, at least one of the lateral extension A the antenna portions 10a, the thickness or height T of the antenna portions 10a and the distance D between the at least two antenna portions 10a may be controlled based on the wavelength of photons emitted by the light emitting device.

The antenna layer 10 may comprise or define a resonant wavelength. At the resonant wavelength, optical absorption of photons emitted by the light emitting device may be increased or maximised in the antenna layer 10, e.g. the plurality of antenna portions 10a. The resonant wavelength of the antenna layer may be same or substantially the same as a wavelength of photons emitted by the light emitting device. The resonant wavelength of the antenna layer may be or comprise the resonant wavelength the LSP mode.

By controlling and/or adjusting at least one or all parameters of the antenna layer 10, e.g. the antenna portions 10a, a highly-ordered array of antenna portion 10a may be formed with increased precision. This may allow for an increased confinement of the surface plasmons in the antenna layer 10 and/or an increased interaction or resonance between the antenna layer 10, e.g. the LSP mode and the SPP mode. The increased interaction or resonance between the LSP and SPP modes may result in an increased energy extraction or out-coupling from the SPP mode, thereby leading to an increased Purcell factor. Additionally or alternatively, the resonant wavelength of the LSP mode may be varied, controlled or adjusted, e.g. by varying one or more parameters of the antenna layer 10.

FIG. 2 shows a schematic top view of the particles 2 on the surface 4a of the support layer. The method 100 may comprise providing or arranging the particles 2 on the support layer 4, e.g. the surface 4a thereof, in a periodic arrangement or array. It will be appreciated that in other embodiments, the particles may be arranged or provided in a quasiperiodic arrangement. The particles 2 may form a close-packed arrangement on the support layer 4. For example, the particles 2 may be arranged or provided in a hexagonal closed-packed arrangement or array on the support layer 4, e.g. the surface 4a thereof. In this embodiment, the particles 2 may be considered as being provided or arranged in a monolayer with a hexagonal closed-packed lattice on the support layer 4. It can be seen from FIG. 2, that each space 6 is formed between three adjacent or neighbouring particles 2. It will be appreciated that in other embodiments, at least one or each space may be formed between more or less than three particles.

FIG. 3 shows a scanning electron microscope image of an antenna layer 10 formed using the method 100 described herein. In the example shown in FIG. 3, the particles 2 have been arranged in a hexagonal close-packed arrangement or array, as shown in FIG. 2. The antenna portions 10a may each have one or more pointed, tapered or sharp ends 10b. The pointed, tapered or sharp ends 10b of the antenna portions 10a may define an angle α of about 60 degrees. In the example shown in FIG. 3, each of pointed, tapered or sharp ends 10b defines substantially the same angle of about 60 degrees. In this embodiment, the hexagonal closed-packed arrangement of the particles resulted in the antenna portion 10a each having a substantially triangular footprint, such as a substantially equilateral triangular footprint. It will be appreciated that in other embodiments, at least one or each antenna portion may have a different footprint, such as a circular or other polygonal footprint.

A width W of the pointed, tapered or sharp ends 10b of the antenna portions 10a may be in the region of about 2 nm to 20 nm. The pointed, tapered or sharp ends 10b of the antenna portions 10a may allow for an enhancement of one or more electric fields near the antenna layer 10, e.g. the antenna portions 10a. For example, an increase in sharpness or decrease in the angle α of the pointed, tapered or sharp ends 10b of the antenna portions 10a may result in an enhancement of the one or more electric fields near the antenna layer 10, e.g. the antenna portions 10a.

As can be seen in FIG. 3, the distance between at least two antenna portions 10a can vary in a lateral direction. For example, the distance between the at least two antenna portions 10a may comprise a first distance D1. The first distance D1 comprises a distance between at least two adjacent and/or opposing antenna portions. For example, the first distance D1 may be defined between at least two opposing antenna portions that are formed or arranged closest to each other. The first distance may comprise a minimal distance between the at least two opposing antenna portions 10a. In this embodiment, the first distance D1 is about 20 nm or less. It will be appreciated that in other embodiments, the first distance may be in the range of about 5 nm to 20 nm or more than about 20 nm.

The distance between the at least two antenna portions 10a may comprise a second distance D2. The second distance may be defined between at least two opposing antenna portions 10a that are formed or arranged furthest from each other. The second distance D2 comprises a maximum distance between the at least two opposing antenna portions. The second distance D2 may be determined by the size or diameter of each particle 2. In this embodiment, the second distance D2 is about 300 nm or less. It will be appreciated that in other embodiments, the second distance may be more than 300 nm. It will be appreciated that the at least two antenna portions may oppose each other in the lateral direction.

The antenna portions 10a are arranged in periodic arrangement of array, which may have a pitch of about 100 nm to 1000 nm. The term "pitch" may be understood as encompassing a distance between at least two antenna portions 10a. In this embodiment, the pitch may be or comprise the second distance D2.

As can be seen in FIG. 3, in this embodiment, the antenna portions 10a may be arranged in a hexagonal array. The antenna portions 10a may be uniform in shape, lateral extension A and/or thickness T. For example, the antenna portions 10a may have the same, e.g. substantially the same, shape, lateral extension A and/or thickness T. The distance, e.g. the first distance D1 and/or second distance D2, between two antenna portions 10a may be the same, e.g. substantially the same. For example, the lateral extension A of each antenna portion 10a is about 100 nm or less. In the example shown in FIG. 3, two adjacent antenna portions 10a form a substantially bow-tie structure. In this example, the lateral extension A of the antenna portions 10a, the thickness T of the antenna portions 10a, the distance, e.g. the first and second distances, between two antenna portions 10a and/or the shape or structure of the antenna portion 10a may lead to a strong and/or increased confinement of the surface plasmons in the antenna layer 10a. For example, the surface plasmons may be confined between two adjacent antenna portions 10a, e.g. between the sharp, tapered or pointed ends 10b of the antenna portions 10a. As described above, the surface plasmons may additionally or alternatively be confined in the antenna portions 10a and/or between the antenna layer 10 and an electrode of the light emitting device, which may be arranged or formed in proximity to the antenna layer. A density of the antenna portions may be calculated based on the periodicity of the antenna array and/or a distance between two antenna portions, For example, based on a hexagonal arrangement of the antenna portions and the second distance of 300 nm or less, the density of the antenna portions may be calculated to be about $8.55/\mu m^2$.

The step (105) of arranging the particles 2 on the support layer 4 may include the use of an assembly method 200, for an example a colloidal assembly method, such as the Langmuir-Blodgett assembly method.

FIG. 4 shows an exemplary process flow of the assembly method 200. In step 205, the method may comprise depositing or providing the particles 2 on a precursor substrate 12. The precursor substrate 12 may be provided in the form of a hydrophilic substrate, such as a hydrophilic silicon substrate. The particles 2 may be irregularly, arbitrarily or randomly arranged on the precursor substrate 12. Expressed differently, the particles 2 may form a monolayer with random, arbitrary, irregular or no order on the precursor substrate 12. The particles 2 may be provided in a colloidal suspension, which is deposited on the precursor substrate 12, e.g. using a spin-coating process.

The method 200 may comprise 12 may immersing the precursor substrate 12 into water to form an air-water interface on the precursor substrate 12. The immersion of the precursor substrate 12 may release the particles 2 on to the air-water interface on the precursor substrate 12.

In step 210, the assembly method 200 may comprise causing the particles 2 to form a periodic or quasiperiodic array or arrangement of particles 2 on the precursor substrate 12. In other words, step 210 may comprise causing the particles 2 to arrange themselves in the periodic or quasiperiodic array or arrangement of particles 2 on the precursor substrate 12. The step 210 of causing the particles 2 to form the periodic or quasiperiodic array or arrangement of particles 2 may comprise adding or depositing a surfactant (not shown) on the particles 2 and/or the precursor substrate 12. The surfactant may comprise molecules, which comprise a hydrophobic part or tail and a hydrophilic part or head. The hydrophobic part or tail favours interaction with the air of the air-water interface on the precursor substrate 12 and the hydrophilic part or head favours interaction with the water of the air-water interface on the precursor substrate 12. This may cause the molecules to arrange themselves on the precursor substrate 12, thereby causing movement of the particles 2. The molecules of the surfactant and/or the particles 2 may arrange or move themselves into a closed-packed arrangement of molecules and/or particles 2. The surfactant may comprise a compound, which is insoluble in water. In this example, the surfactant may comprise 2% sodium dodecyl sulphate.

In step 215, the assembly method 200 may comprise removing the array of particles 2 from the precursor substrate 12. In step 220, the assembly method 200 comprises transferring the array of particles 2 on the support layer 4.

In some embodiments, the support layer 4 may comprise a conducting material. In such embodiments, the method 100 comprises depositing an insulating material on the particles 2 so that a portion of the insulating material passes through some or all of the spaces 6 between two particles 2 on to the support layer 4. The insulating material may be deposited on the particles 2 prior to the step (110) of depositing the material 8 on the particles 2.

Figure 5A:
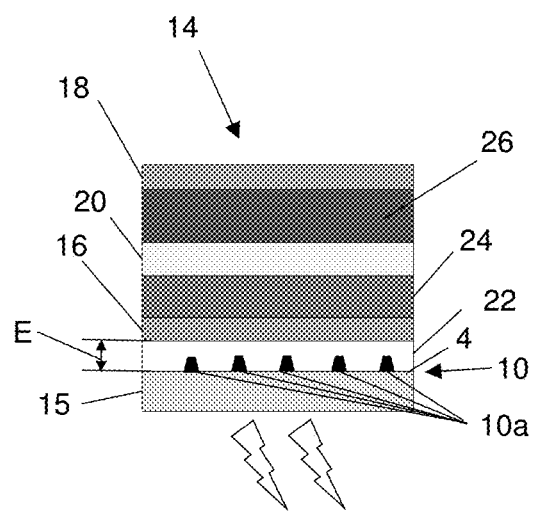
FIGS. 5A to 5D depict exemplary embodiments of a light emitting device.

FIGS. 5A to 5D show exemplary embodiments of light emitting devices 14. Each of light emitting device 14 is provided in the form of an OLED. Each of the light emitting devices 14 shown in FIGS. 5A to 5D comprises the support layer 4, a first electrode 16 and a second electrode 18. Each of the light emitting devices comprises an antenna layer 10, which is arranged or formed in proximity to at least one of the first and second electrodes 16, 18. In the embodiments shown in FIGS. 5A to 5D, the antenna layer 10 is arranged or formed in proximity to the first electrode 16, e.g. above or below the first electrode 16. The antenna layer 10 may be arranged or formed at a distance E from the first electrode 16. The distance E is indicated in FIG. 5A. The distance E between the antenna layer 10 and the first electrode 16 may be selected to allow for increased interaction between the LSP and SPP modes. The distance E between the antenna layer 10 and the first electrode 16 may be selected to allow for increased out-coupling of energy from the SPP mode. For example, the distance E between the antenna layer 10 and the first electrode 16 may be in the range of about 10 nm to 40 nm, such as about 20 nm. It will be appreciated that in other embodiments, the antenna layer may be formed or arranged in proximity to the second electrode.

The antenna layer 10 is arranged or formed between the support layer 4 and the second electrode 18. The antenna layer 10 may be formed, as described above in relation to FIGS. 1 to 4. As shown in FIGS. 5A to 5D, the antenna layer 10 comprises a plurality of antenna portions 10a, which in this example form a periodic arrangement or array of antenna portions 10a.

By arranging the antenna layer 10 in proximity to the first electrode 16, coupling of energy to the SPP mode may be facilitated and/or increased, e.g. in use. This may allow for a decrease in the triplet concentration, which in turn may result in an increased lifetime of the light emitting device 14. This may also allow for an improved interaction or resonance between the SPP mode and the LSP mode, e.g. to out-couple and/or extract energy from the SPP mode. The improved interaction or resonance between the LSP and SPP modes may lead to an increase in performance and/or stability of the light emitting device.

Additionally or alternatively, the arrangement or formation of the antenna layer 10 between the support layer 4 and the second electrode 18 may allow for the use of the light emitting device 14 in solid-state lighting and/or in a display. Expressed differently, the antenna layer 10 may be part of an internal structure of the light emitting device 14, which may facilitate the incorporation of the light emitting device 14 in solid-state lighting and/or in a display.

Each of the light emitting devices 14 shown in FIGS. 5A to 5D may comprise an emissive layer 20. The emissive layer 20 is arranged or formed between the first and second electrodes 16, 18. The emissive layer 20 is configured to emit photons, e.g. when a voltage is applied to the first and second electrodes 16, 18. For example, the emissive layer 20 may comprise a phosphorescent organic emitter, such as Bis[2-(4,6-difluorophenyl)pyridinato-C2,N](picolinato) iridium (Flrpic) or tris(2-phenyl-pyridine)iridium(III) (Ir(ppy)$_3$). It will be appreciated that in other embodiments, other emitters may be used. For example, in other embodiments, the emissive layer may comprise a fluorescent emitter, a thermally activated delayed fluorescent (TADF) emitter. The emissive layer may comprise molecules, polymers or even inorganic structures or materials, such as quantum dots or perovskite material, which may be compatible with the at least some parts or all of the light emitting devices described herein.

As shown in FIGS. 5A to 5D, the emissive layer 20 is arranged or formed between the antenna layer 10 and the second electrode 20. Each of the light emitting device 14 may comprise a substrate 15. In the embodiment shown in FIG. 5A, the substrate 15 comprises or defines the support layer 4.

The exemplary light emitting device 14 shown in FIG. 5A may be considered as a bottom emitting light emitting device 14. Expressed differently, in the light emitting device 14 shown in FIG. 5A, photons, which are indicated by the lightning bolts in FIG. 5A, may be emitted through the first electrode 16. In this example, the electrode 16 may comprise a conductive material. The material of the first electrode 16 may be selected to be transparent, e.g. substantially transparent, to the photons emitted by the light emitting device 14. For example, the material of the first electrode 16 may comprise a metal, such as aluminium (Al), copper (Cu) or the like, or transition metal, such as gold (Au), silver (Ag), or the like. A thickness of the first electrode 16 may be selected to be in the range of about 5 nm to 50 nm, e.g. 20 nm. The thickness of the first electrode 16 may be selected to balance the coupling of energy to the SPP mode and the air mode.

In the embodiment shown in FIG. 5A, the antenna layer 10 is formed on the substrate 15. In other words, the antenna portions 10a were formed on the substrate 15, as described above. The substrate 15 may be selected to be transparent, e.g. substantially transparent, to photons emitted by the light emitting device 14. For example, the substrate 15 may comprise an oxide material, such as silicon dioxide (glass) or the like.

The light emitting device 14 may comprise a dielectric layer 22. The antenna layer 10 may be arranged or formed between the substrate 15 and the dielectric layer 22. For example, the dielectric layer 22 may be formed or arranged on the antenna layer 10, e.g. on the antenna portions 10a. The dielectric layer 22 may be formed or arranged on the antenna layer 10 to provide a planar surface for the first electrode 16, which can be formed or arranged thereon.

Additionally or alternatively, the dielectric layer 22 may define a metal-dielectric interface with the first electrode 16. One or more SPP modes may travel along the metal-dielectric interface between the dielectric layer 22 and the first electrode 16. The dielectric layer 22 may comprise an insulating material, such as an organic or inorganic insulating material. For example, the insulating material may comprise an acrylic material, such as polymethyl methacrylate (PMMA) or an oxide material, such as silicon dioxide. The dielectric layer 22 may comprise a thickness of about 20 nm to 40 nm.

The light emitting device 14 may comprise one or more charge transport layers, charge injection layers and/or charge blocking layers. The charge transport layers may be configured to facilitate transport of charge carriers in the light emitting device 14, e.g. in use. The charge injection layers may be configured to facilitate charge carrier injection in the light emitting device 14, e.g. in use. The charge blocking layers may be configured to confine charge carrier recombination to the emissive layer 20, e.g. in use.

In the exemplary embodiment shown in FIG. 5A, the light emitting device 14 comprises a hole transport layer 24 for facilitating hole transport in the light emitting device 14. The light emitting device 14 comprises an electron transport layer for facilitating electron transport in the light emitting device 14. The hole transport layer 24 and the electron transport layer 26 are arranged or formed on either side of the emissive layer 20. The hole and electron transport layers 24, 26 may be arranged or formed between the antenna layer 10 and the second electrode 18. In the embodiment shown in FIG. 5A, the hole transport layer 24 is arranged or formed between the antenna layer 10 and the emissive layer 20. The electron hole transport layer 26 is formed or arranged between the emissive layer 20 and the second electrode 18. In this embodiment, the arrangement of the hole transport layer 24, electron transport layer 26 and the emissive layer 20 may define a p-i-n structure. However, it will be appreciated that in other embodiments, the hole transport layer, the electron transport layer and the emissive layer may be arranged or formed to define a n-i-p structure, e.g. by changing the order of these layers.

The hole transport layer 24 may comprise an organic material, such as 1,1-Bis[(di-4-tolylamino)phenyl]cyclohexane (TAPC). The electron transport layer 26 may comprise an organic material, such as Bathophenanthroline (BPhen) or 2,9-Bis(naphthalen-2-yl)-4,7-diphenyl-1,10-phenanthroline (NBPhen). It will be appreciate that in other embodiments other materials may be used for the hole and/or electron transport layers.

It will be appreciated that in other embodiments, the light emitting device may comprise further layers, such as one or more charge injection layers, e.g. hole and/or electron injection layers, and/or charge blocking layers, e.g. hole and/or electron blocking layers. The further layers may be included in the light emitting device, for example, to improve the balance of charge carriers in the light emitting device and/or the exciton confinement.

A thickness of the emissive layer 20, the hole transport layer 24 and/or the electron transport layer 26 may be selected to allow for coupling of energy in the form of photons from the emissive layer 20 to the SPP mode at the first electrode 16 and/or to the air mode for extraction. The coupling strength to the SPP mode may be determined by a distance between the emissive layer 20 and one of the first and second electrodes 16, 18. By decreasing the distance between the emissive layer 20 and one of the first and second electrodes 16, 18, the SPP coupling strength may be increased. In the embodiments shown in FIGS. 5A to 5D, the distance between the emissive layer 20 and the first electrode 16 may be determined by the thickness of the hole transport layer 24. For example, a thickness of the hole transport layer 24 may be in the range of about 20 nm to 60 nm. For example, in the embodiments shown in FIGS. 5A to 5C, the thickness of the hole transport layer 24 may be about 20 nm, e.g. to allow for increased coupling of energy to the SPP mode. It will be appreciated that in other embodiments, the hole transport layer may have a thickness larger or smaller than 20 nm. For example, in other embodiments, the hole transport layer may have a thickness of about 25 nm or 50 nm.

The distance between the emissive layer 20 and the second electrode 18 may be determined by the thickness of the electron transport layer 26. To increase the SPP coupling strength the thickness of the hole transport layer 24 may be selected to be smaller than the thickness of the electron transport layer 26, or vice versa. A thickness of the electron transport layer 26 may be in the range of about 20 nm to 60 nm, e.g. 50 nm. It will be appreciated that in other embodiments increased coupling of energy to the SPP mode at the second electrode may be additionally or alternatively desired. In such embodiments, the thickness of the electron transport layer may be the same as the thickness of the hole transport layer, e.g. 20 nm, or smaller than the thickness of the hole transport layer.

A thickness of the emissive layer 20 may be about 10 nm to 30 nm, e.g. 20 nm. It will be appreciated that in other embodiments a different thickness for the electron transport layer and/or emissive layer may be selected.

The second electrode 18 is arranged or formed on the electron transport layer 26. The second electrode 18 may comprise a conductive material. The conductive material may comprise a metal, such as aluminium (Al) or copper (Cu), or a transition metal, such as gold (Au) or silver (Ag) or the like. A thickness of the second electrode 18 may be in the range of about 50 nm to 150 nm, e.g. 100 nm.

Figure 5B:
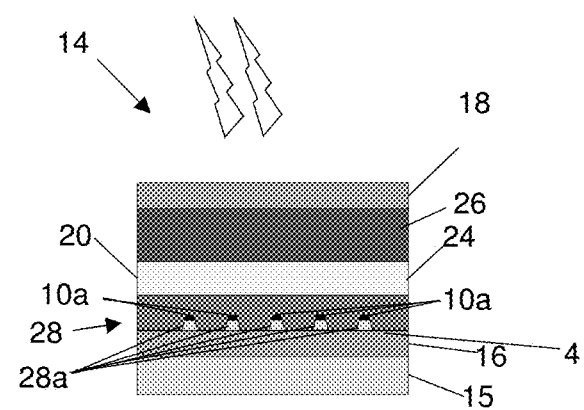
Figure 5C:
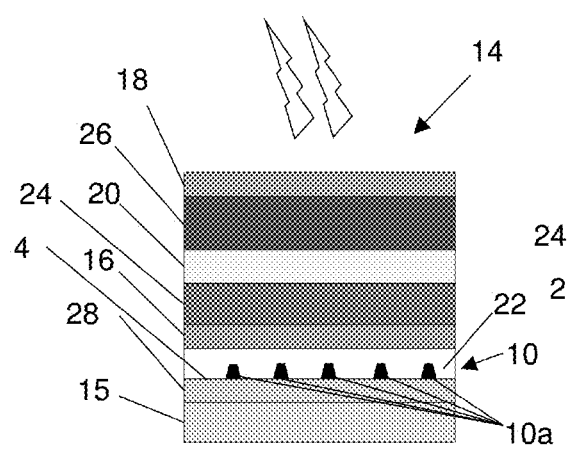

FIGS. 5B and 5C may be considered as top-emitting light emitting devices 14. In words, photons may be emitted through the second electrode 18. The light emitting devices 14 shown in FIGS. 5B and 5C are similar to the light emitting device shown in FIG. 5A. As such, any features described in relation to the light emitting device 14 shown in FIG. 5A may also apply to the light emitting devices shown in FIGS. 5B and 5C. In the following description only differences between the light emitting devices shown in FIGS. 5A to 5C will be described.

Referring to FIG. 5B, the first electrode 16 is arranged or formed between the antenna layer 10 and the substrate 15. In other words, the antenna layer 10 is formed or arranged on the first electrode 16. In this embodiment, the first electrode 16 may be configured to reflect light emitted by the emissive layer 20 towards the second electrode 18. The first electrode 16 may comprise a conductive and reflective material. The conductive and reflective material may comprise a metal, such as aluminium (Al), copper (Cu), or a transition metal, such as silver (Ag) or gold (Ag), or the like. In this embodiment, the support layer 4 may be part of, defined by or comprised in the first electrode 16. In this embodiment a thickness of the first electrode 16 may be increased relative to a thickness of the first electrode 16 of the light emitting device 14 shown in FIG. 5A. For example, in this embodiment, a thickness of the first electrode 16 may be in the range of about 50 nm to 150 nm, such as 100 nm.

In this embodiment, the light emitting device 14 may comprise an insulating layer 28. The insulating layer may be configured to electrically insulate the antenna layer 10, e.g. the antenna portions 10a, from the first electrode 16. The insulating layer 28 may comprise a thickness in the range of about 10 nm to 30 nm, such as 20 nm. The insulating layer 28 may be part of or comprised in the antenna layer 10. For example, the insulating layer 28 may comprise a plurality of insulating portions 28a. Each insulating portions 28a may be associated with an antenna portion 10a. Each insulating portion 28a may be arranged between the first electrode 16 and the associated antenna portion 10. The insulating layer 28 may be formed in a similar manner as the antenna layer 10. As described above in relation to the method 100 of forming the antenna layer 10, an insulating material may be deposited on the particles 2, e.g. so that portions of the insulating material are deposited on support layer 4, e.g. the first electrode 16 in this embodiment, in the spaces between at least two particles 2. The insulating material may be deposited on the particles 2, prior to the step of depositing the material 8 on the particles 2. Each portion of the insulating material may define an insulating portion 28a. The insulating material may comprise an organic or inorganic material. For example, the insulating material may comprise organic molecules, such as 1,1-Bis[(di-4-tolylamino)phenyl]cyclohexane (TAPC), 4,4'-Bis(N-carbazolyl)-1,1'-biphenyl (CBP) or the like. In some embodiments, the insulating material may comprise an inorganic material. The inorganic material may comprise an oxide, such as silicon dioxide or aluminium oxide or the like.

In the embodiment shown in FIG. 5B, the hole transport layer 24 is formed or arranged on the antenna layer 10.

The second electrode 18 may comprise a conductive material. The conductive material may be transparent, e.g. substantially transparent to the photons emitted by the light emitting device 14. For example, the material of the second electrode 18 may comprise a metal, transition metal or metal alloy, such as silver (Ag) or a magnesium silver alloy (Mg:Ag) or the like, or an oxide material, such as indium tin oxide (ITO) or indium zinc oxide (IZO) or the like.

The light emitting device 14 shown in FIG. 5C is similar to the light emitting device 14 shown in FIG. 5B. The substrate 15 comprises a reflective substrate, e.g. for reflecting photons emitted by the emissive layer 20 towards the second electrode 18. The substrate 15 may comprise a conducting material or an insulating material. When the substrate comprises a conductive material, as shown in FIG. 5C, the light emitting device 14 comprises an insulating layer 28. The insulating layer 28 is arranged or formed between the substrate 15 and the antenna layer 10. The insulating layer 28 may be configured to electrically insulate the antenna layer 10 from the substrate 15. The remaining part of the light emitting device 14 shown in FIG. 5C is the same as that shown in FIG. 5A, except the second electrode 18, which is transparent, e.g. substantially transparent, to the photons emitted by the light emitting device 14, as described in relation to FIG. 5B.

Figure 5D:
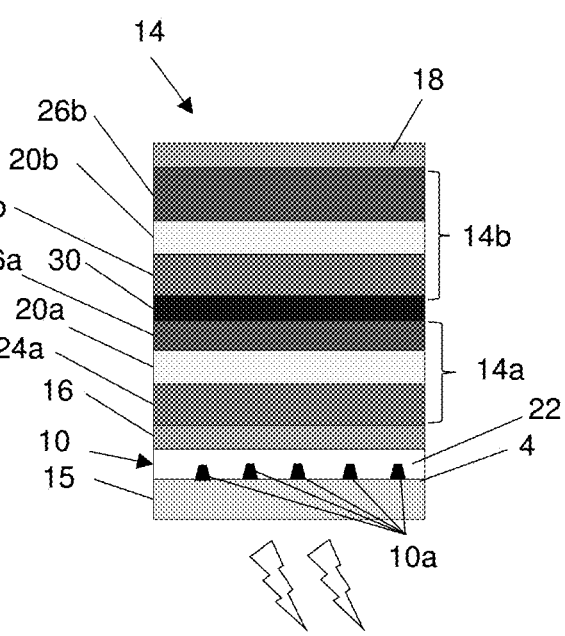

FIG. 5D shows another exemplary embodiment of the light emitting device 14. The light emitting device shown in FIG. 5D is similar to the light emitting device described above in relation to FIG. 5A. The light emitting device 14 shown in FIG. 5D comprises a tandem OLED. In this embodiment, the light emitting device 14 comprises a first emissive layer 20a and a second emissive layer 20b. The first emissive layer 20a may be configured to emit photons having a first wavelength, e.g. when a voltage is applied to the first and second electrodes 16, 18. The second emissive layer 20b may be configured to emit photons having a second wavelength, e.g. when a voltage is applied to the first and second electrodes 16, 18. The first and second wavelengths may be different. For example, the first emissive layer 20*a* may be considered as a blue emitter. The first wavelength may be in the range of about 450 nm to 495 nm. In this embodiment, the first wavelength is about 470 nm. The second wavelength may be in the range of about 560 nm to 590 nm. In this embodiment, the second wavelength is about 560 nm. The first emissive layer may comprise a phosphorescent material, such as Bis[2-(4,6-difluorophenyl) pyridinato-C2,N](picolinato)iridium (Flrpic). A thickness of the first emissive layer 20*a* may be in the range of about 5 nm to 30 nm, e.g. 10 nm. The second emissive layer 20*b* may be considered as a yellow emitter. The second emissive layer 20*b* may comprise a phosphorescent material, such as Bis (2-phenylbenzothiazolato)(acetylacetonate)iridium(III) (Ir $(BT)_2$(acac)). A thickness of the second emissive layer 20*b* may be in the range of about 2 nm to 10 nm, e.g. 5 nm. In this embodiment, the light emitting device 14 may be considered as emitting white, e.g. substantially white, light. The light emitting device 14 may be configured to emit photons having a wavelength in the range of about 450 nm to 700 nm.

The light emitting device 14 may comprise a plurality of charge transport layers. For example, the light emitting device 14 may comprise a first hole transport layer 24*a*, a second hole transport layer 24*a*, a first electron transport layer 26*a* and a second transport layer 26*b*. The first emissive layer 20*a* is arranged or formed between the first hole transport layer 24*a* and the first electron transport layer 26*a*. The second emissive layer 20*b* is arranged or formed between the second hole transport layer 24*b* and the second electron transport layer 24*b*. The light emitting device may comprise a charge generation layer 30. The charge generation layer 30 may be configured to inject charge carriers, e.g. electrons and/or holes. The charge generation layer 30 is configured to act as an artificial electrode, e.g. an anode or cathode, e.g. by supplying the first and/or second emissive layers 20*a*, 20*b* with charge carriers. The light emitting device 14 may be considered as having a first part 14*a* and a second part 14*b*. The first part 14*a* of the light emitting device 14 may comprise the first emissive layer 20*a*, the first hole transport layer 24*a* and the first electron transport layer 26*a*. The second part 14*b* of the light emitting device 14 may comprise the second emissive layer 20*b*, the second hole transport layer 24*b* and the second electron transport layer 26*b*. The charge generation layer 30 is arranged or formed between the first and second parts 14*a*, 14*b* of the light emitting device 14. The charge generation layer 30 may be configured to connect the first part 14*a* of the light emitting device 14 with the second part 14*b* of the light emitting device 14. The charge generation layer 30 may comprise an organic material, such as Cs:2,9-dimethyl-4,7-diphenyl-1, 10-phenanthroline (BCP), and/or an oxide material, such as indium tin oxide (ITO). The charge generation layer 30 may comprise a thickness in the range of about 30 nm to 100 nm.

In the exemplary embodiment shown in FIG. 5D, the second electron transport layer 26*b* may comprise a thickness of about 100 nm to 300 nm, e.g. 250 nm. In this embodiment, the first hole transport layer 24*a* has a thickness of about 25 nm to allow for increased coupling of the energy to the SPP mode.

Figure 6:
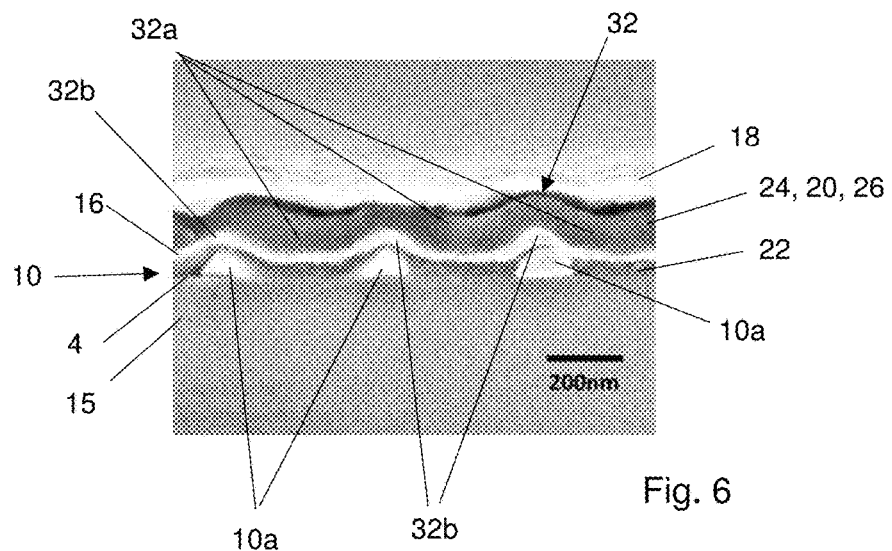
FIG. 6 depicts a cross-sectional scanning electron image of the light emitting device of FIG. 5A.

FIG. 6 shows a cross-sectional scanning electron image of the light emitting device 14 shown in FIG. 5A. In FIG. 6, three antenna portions 10*a* are shown, which are periodically arranged. It can be seen from this figure that each antenna portion 10*a* has a triangular, e.g. substantially triangular, cross-section. Expressed differently, each antenna portion may have a pyramidal or truncated pyramidal shape. It will be appreciated that in other embodiments, the antenna portions may have a different shape, such as a cylindrical shape, truncated cone shape, cone shape or the like.

The light emitting device 14 comprises a corrugated structure 32. The antenna portions 10*a* cause the dielectric layer 22, the first electrode 16, the hole transport layer 24, emissive layer 20, electron transport layer and the second electrode 18 to define the corrugated structure 32. Expressed differently, each of the dielectric layer 22, the first electrode 16, the hole transport layer 24, emissive layer 20, electron transport layer and the second electrode 18 comprise one or more grooves 32*a* and ridges or peaks 32*b*, which are indicated in FIG. 6 for the dielectric layer 22 only for the sake of clarity. It will be appreciated that in other embodiments, the antenna portions may cause at least one of the layer of the light emitting device to define a corrugated structure. The corrugated structure 32 may be configured to increase out-coupling or extracting of energy from the light emitting device 14. In this embodiment, the pitch may be or comprise a distance between at least two ridges or peaks 32*b*. Expressed differently, the pitch may comprise a peak-to-peak distance of the corrugated structure 32. The peak-to-peak distance may be the same as the second distance D2.

Figure 7:
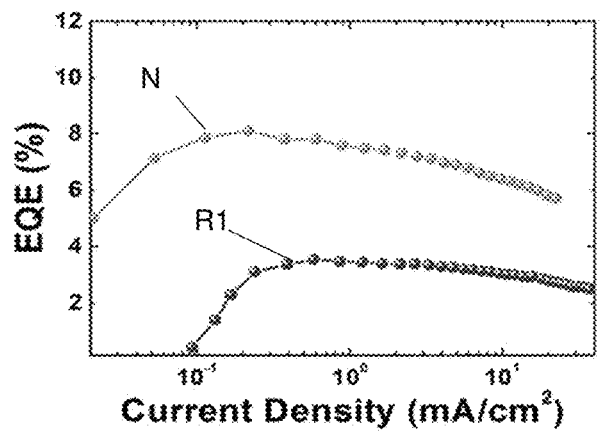
FIG. 7 depicts a graph of the external quantum efficiency over the current density for a light emitting device comprising an antenna layer and a first reference device.
Figure 8:
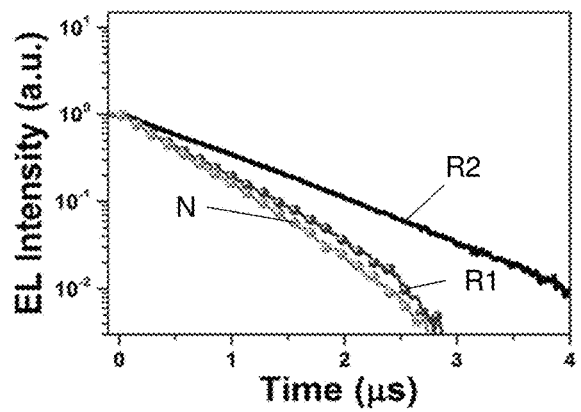
FIG. 8 depicts a graph of time-resolved electroluminescence measurements for a light emitting device comprising the antenna layer, a first reference device and a second reference device.
Figure 9:
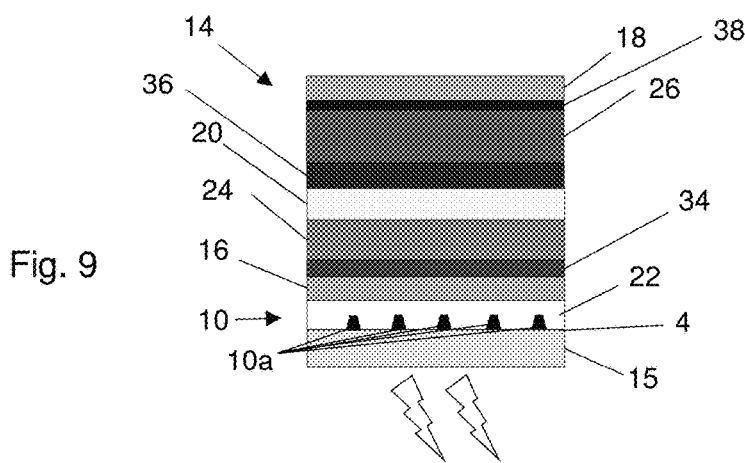
FIG. 9 depicts another exemplary embodiment of a light emitting device for which the external quantum efficiency and time-resolved electroluminescence was measured and is shown in FIGS. 8 and 9, respectively.

FIG. 7 shows a graph of the external quantum efficiency (EQE) over the current density for a light emitting device comprising an antenna layer, as described herein, and a light emitting device without an antenna layer, which will be referred to as a first reference device. FIG. 8 shows a graph of time-resolved electroluminescence (EL) measurements for the light emitting device comprising the antenna layer and the first reference device. FIG. 9 schematically shows the light emitting device 14 for which the external quantum efficiency and time-resolved electroluminescence was measured and plotted in FIGS. 8 and 9, respectively.

The light emitting device 14 shown in FIG. 9 is similar to that shown in FIG. 5A. As such, any of the features described above in relation to the light emitting device 14 shown in FIG. 5A may also apply to the light emitting device 14 shown in FIG. 9. In the exemplary embodiment shown in FIG. 9, the emissive layer 20 comprises tris(2-phenyl-pyridine)iridium(III) (Ir(ppy)$_3$). The light emitting device 14 comprises a hole injection layer 34. The hole injection layer 34 may comprise an organic material, such as 1,4,5,8,9,11-Hexaazatriphenylenehexacarbonitrile (HAT-CN). The hole injection layer 34 may comprise a thickness of about 5 nm to 20 nm, e.g. 5 nm. The hole injection layer 34 is arranged or formed between the first electrode 16 and the hole transport layer 24. The light emitting device 14 comprises a hole blocking layer 36. The hole blocking layer 36 may comprise an organic material, such as 4,6-Bis(3,5-di(pyridin-3-yl)phenyl)-2-methylpyrimidine (B3PyMPM). The hole blocking layer 36 may have a thickness of about 5 nm to 20 nm, e.g. 10 nm. The hole blocking layer 36 is arranged or formed between the emissive layer 20 and the electron transport layer 26. The light emitting device 14 comprises an electron injection layer 38. The electron injection layer 38 is arranged or formed between the electron transport layer 26 and the second electrode 18. The electron injection layer 38 may comprise an organic material, such as 8-Hydroxyquinolinolato-lithium (Liq). The electron injection layer 38 may comprise a thickness of about 2 nm to 10 nm, e.g. 2 nm.

The first reference device (not shown) has substantially the same structure as the light emitting device 14 shown in FIG. 9. However, as described above, the first reference light emitting device does not include an antenna layer. Data point associated with the first reference device are indicated by reference numeral R1 in FIGS. 7 and 8. Data points associated with the light emitting device 14 shown in FIG. 9 are indicated by reference numeral N in FIGS. 7 and 8.

FIG. 7 shows an increased external quantum efficiency of the light emitting device 14 compared to the reference device R1. The external quantum efficiency may be used to describe an efficiency of a light emitting device and provides an indication of the number of emitted photons per injected charge. It can be seen from FIG. 7 that the light emitting device 14 has a maximum external quantum efficiency of about 8.1% relative to a maximum external quantum efficiency of about 3.5% for the first reference device R1. The enhancement of the external quantum efficiency may calculated to be about 131%. Therefore, by providing the light emitting device with an antenna layer, as described above, an efficiency or performance of the light emitting device may be increased.

FIG. 8 shows a graph of time-resolved electroluminescence measurements for the light emitting device shown in FIG. 9, the first reference device and a second reference device R2. The second reference device R2 has a similar structure as the first reference device R1. However, a distance between a first electrode and an emissive layer of the second reference device is increased relative to a distance between the first electrode and the emissive layer of the first reference device. For example, the distance between the first electrode and the emissive layer of the second reference device may be larger than 25 nm. Additionally, the first electrode of the second reference device may comprise an oxide material, such as indium tin oxide (ITO), instead of a metal or transition metal material.

From the time-resolved electroluminescence measurements, an exciton lifetime of 940 ns was determined for the second reference device, 558 ns for the first reference device and 478 ns for the light emitting device 14, which is shown in FIG. 9. The decreased exciton lifetime for the first reference device leads to a Purcell factor of 1.68, whereas the exciton lifetime for the light emitting device 14 shown in FIG. 9 leads to a Purcell factor of 2. The increased Purcell factor of the light emitting device 14 may be indicative of an increase in the operational lifetime of the light emitting device 14. The decreased exciton lifetime for the light emitting device 14 may be indicative of increased SPP coupling between the first electrode 16 and the emissive layer 20 and/or increased direct out-coupling of photons from the emissive layer 20, which both may be due to the provision of the antenna layer 10 in the light emitting device 14. Expressed differently, a distance between the antenna layer 10 and the emissive layer 20 may be sufficiently decreased in the light emitting device 14 to allow for increased SPP coupling between the first electrode 16 and the emissive layer 20, increased interaction or resonances between the LSP and SPP modes and/or increased direct out-coupling of photons from the emissive layer 20 into the air mode.

Figure 10:
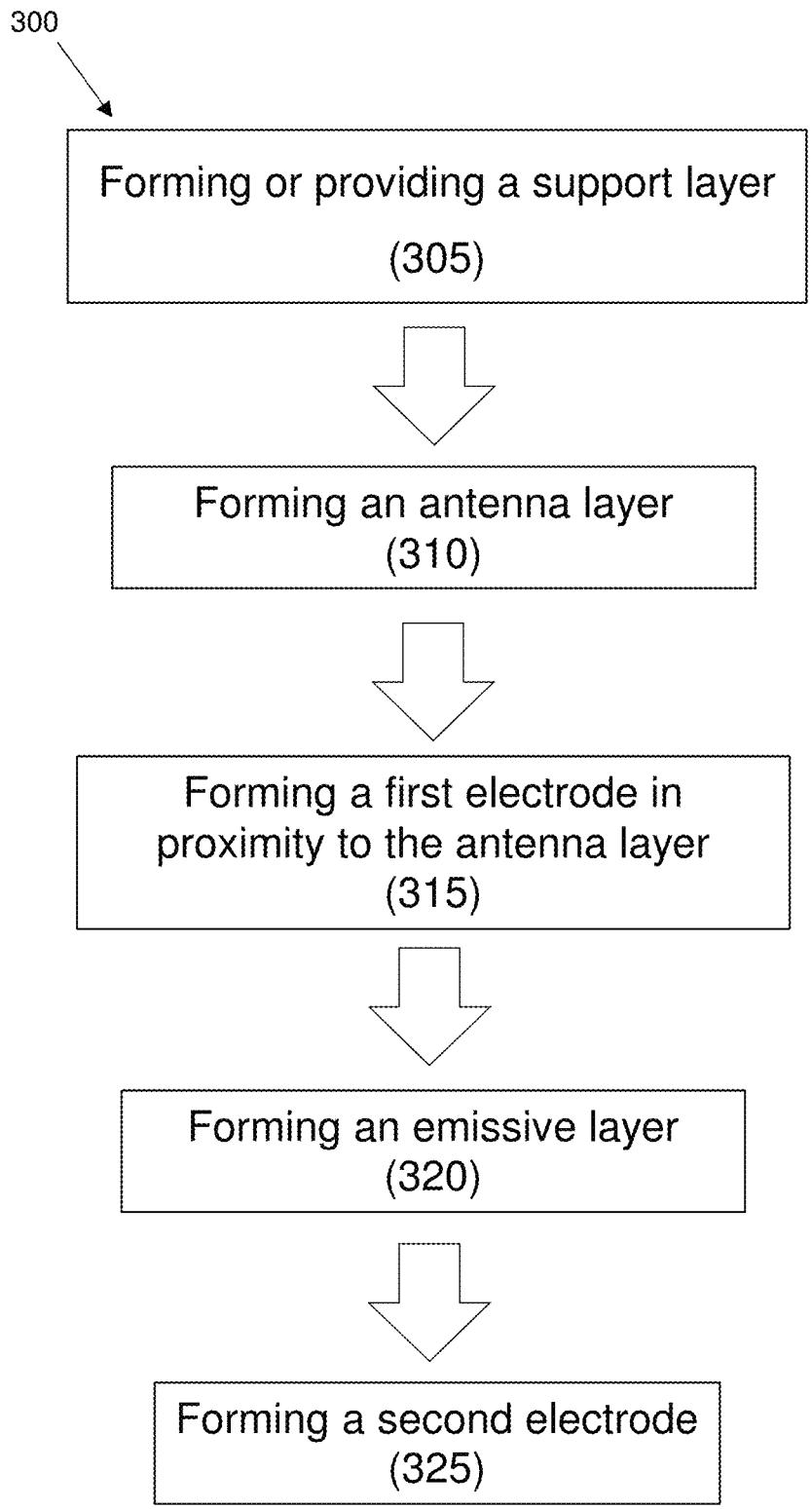
FIG. 10 depicts an exemplary flow diagram outlining the steps of a method of forming a light emitting device.

FIG. 10 shows an exemplary flow diagram outlining the steps of a method 300 of forming a light emitting device. The light emitting device may be or comprise any of the light emitting devices 14 described above, e.g. in relation to FIGS. 5A to 5D and 9. Any features described above, e.g. in relation to FIGS. 5A to 5D and 9, may also apply to the method 300.

In step 305, the method 300 comprises forming or providing a support layer. The support layer may be or comprise a substrate 15. Alternatively, the support layer may comprise an insulating layer 28 or be part of the first electrode 16.

In step 310, the method comprises forming an antenna layer 10. The antenna layer may be formed using any of the steps described above in relation to FIGS. 1 and 2. The antenna layer 10 may be formed on the support layer 4.

In step 315, the method comprises forming a first electrode 16 in proximity to the antenna layer 10. It will be appreciated that in some embodiments, the first electrode 16 may be formed prior to the support layer 4 being formed or provided and/or prior to the antenna layer 10 being formed. For example, in the embodiment of the light emitting device 14 shown in 5B, the first electrode 16 was formed prior to the insulating layer 28 and the antenna layer 10. In this embodiment, the step of forming or providing the support layer may comprise the step of forming the first electrode.

By forming first electrode 16 in proximity to the antenna layer 10, coupling of energy to the SPP mode may be increased, as described above. This may allow for a decrease in the triplet exciton concentration, which in turn may result in an increased lifetime of the light emitting device 14.

In step 320, the method comprises forming an emissive layer 20.

In step 325, the method comprises forming a second electrode 18. As described above, the antenna layer 10 is arranged or formed between the support layer and the second electrode 18. The arrangement or formation of the antenna layer 10 between the support layer and the second electrode 18 may allow for the use of the light emitting device 14 in solid-state lighting and/or in a display. Expressed differently, the antenna layer 10 may be part of an internal structure of the light emitting device 14, which facilitates the incorporation of the light emitting device 14 in solid-state lighting and/or in a display.

In some embodiments, the antenna layer may additionally or alternatively be formed in proximity to the second electrode. In such embodiments, the support layer may be or comprise a charge transport layer, such as the electron transport layer 26.

The emissive layer 20 may be formed between the first and second electrodes 16, 18 and configured to emit light, e.g. when a voltage is applied to the first and second electrodes 16, 18.

The method may comprise forming a dielectric layer 22 on the antenna layer 10. The dielectric layer 22 may be formed or arranged on the antenna layer 10, e.g. to provide a planar surface for the first electrode 16 to be formed or arranged on.

The method may comprise forming one or more charge transport layers, charge injection layer and/or charge blocking layer. For example, a hole transport layer 24 and an electron transport layer 28 may be formed on either side of the emissive layer 20. One or more charge injection layers and/or charge blocking layers may be additionally formed, e.g. to improve a balance of charge carriers in the light emitting device and/or to improve confinement of excitons.

The method may comprise selecting a thickness of the at least one of: the charge transport layer, charge injection layer and the charge blocking layer, e.g. to allow for coupling of photons from the emissive layer to the SPP mode and/or for extraction of photons from the light emitting device. For example, a thickness of the hole transport layer 24 may be in the range of about 20 nm to 60 nm, e.g. 20 nm or 50 nm. A thickness of the electron transport layer 26 may be in the range of about 20 nm to 60 nm, e.g. 20 nm or 50 nm, as described above.

The first and second electrodes 16, 18, the emissive layer, charge transport layers, charge injection layers, charge blocking layers, insulating layers and/or dielectric layers may be formed using a deposition method or process, such as vacuum deposition, vacuum thermal evaporation, electron-beam physical vapour deposition, organic vapour phase evaporation, inkjet printing or the like.

It will be appreciated that one or more steps of method 300 may be performed in a different order, in a different combination or in isolation. Additionally or alternatively, it will be appreciated that any of the steps of method 300 may be used to form the first part 14*a* and the second part 14*b* of the light emitting device 14, as shown in the embodiment of FIG. 5D. In such embodiments, the method 300 may comprise forming a charge generation layer between the first and second parts 14*a*, 14*b* of the light emitting device 14.

What is claimed is:

1. A method of forming an antenna layer for use in a light emitting device, the method comprising:
   providing a plurality of particles on a support layer so that a plurality of spaces are formed, each of the plurality of spaces being formed between at least two particles of the plurality of particles, wherein the support layer comprises a conducting material;
   depositing an insulating material on the plurality of particles so that at least a portion of the insulating material passes through some or all of the plurality of spaces on to the support layer to form a plurality of portions of the insulating material on the support layer;
      depositing a material so that at least a portion of the material passes through some or all of the plurality of spaces on the plurality of portions of the insulating material on to the support layer; and
      removing the plurality of particles from the support layer, a plurality of portions of the material remaining on the plurality of portions of the insulating material on the support layer forming the antenna layer, wherein the method further comprises:
      selecting one or more properties of the plurality of particles to adjust or control one or more parameters of the antenna layer, prior to providing the plurality of particles on the support layer.

2. The method of claim 1, wherein the step of providing the plurality of particles on the support layer comprises providing the plurality of particles on the support layer to form a periodic or quasiperiodic arrangement or array.

3. The method of claim 2, wherein the step of providing the plurality of particles on the support layer comprises providing the plurality of particles on the support layer to form a close-packed arrangement or array of particles.

4. The method of claim 1, wherein the one or more properties of the plurality of particles comprise at least one of:
   a size or diameter of each particle of the plurality of particles; and
   a shape of each particle of the plurality of particles.

5. The method of claim 1, wherein the step of providing the plurality of particles on the support layer comprises using a colloidal assembly method.

6. The method of claim 1, wherein the step of providing the plurality of particles on the support layer comprises at least one of:
   depositing the plurality of particles on a precursor substrate;
   causing the plurality of particles to form a periodic or quasiperiodic array or other arrangement of particles on the precursor substrate; and
   removing the array or other arrangement of particles from the precursor substrate; and
   transferring the array or other arrangement of particles on the support layer.

7. The method of claim 1, wherein the one or more parameters of the antenna layer are based on a wavelength of photons to be emitted by the light emitting device.

8. A method of forming a light emitting device, the method comprising:
   forming or providing a support layer;
   forming an antenna layer;
   forming a first electrode in proximity to the antenna layer;
   forming an emissive layer; and
   forming a second electrode, wherein the antenna layer is arranged between the support layer and the second electrode, and wherein the emissive layer is arranged between the first and second electrodes and configured to emit light when a voltage is applied to the first and second electrodes, wherein the step of forming the antenna layer comprises the method of claim 1.

9. A method of forming a light emitting device, the method comprising:
   forming or providing a support layer;
   forming an antenna layer;
   forming a first electrode in proximity to the antenna layer;
   forming an emissive layer; and
   forming a second electrode, wherein the antenna layer is arranged between the support layer and the second electrode, wherein the antenna layer is configured to generate a localised surface plasmon mode and to confine one or more surface plasmons, wherein the emissive layer is arranged between the first and second electrodes and configured to emit light when a voltage is applied to the first and second electrodes, wherein the step of forming the antenna layer comprises:
   providing a plurality of particles on the support layer so that a plurality of spaces are formed, each of the plurality of spaces being formed between at least two particles of the plurality of particles;
   depositing a material so that at least a portion of the material passes through some or all of the plurality of spaces on to the support layer; and
   removing the plurality of particles from the support layer, a plurality of portions of the material remaining on the support layer forming the antenna layer, wherein the method further comprises:
   selecting one or more properties of the plurality of particles to adjust or control one or more parameters of the antenna layer, prior to providing the plurality of particles on the support layer.

10. The method of claim 9, wherein the support layer comprises a substrate or is part of the first electrode.

11. The method of claim 9, wherein the light emitting device comprises an insulating layer and the insulating layer comprises the support layer.

12. The method of claim 9, wherein the light emitting device comprises a bottom-emitting light emitting device and the first electrode is transparent to photons emitted by the light emitting device.

13. The method of claim 9, wherein the light emitting device comprises a top-emitting light emitting device and the second electrode is transparent to photons emitted by the light emitting device.

14. The method of claim 9, wherein the plurality of portions of the material remaining on the support layer comprises a plurality of antenna portions.

15. The method of claim 9, wherein the light emitting device comprises a corrugated structure, the corrugated structure being caused by the plurality of antenna portions.

16. The method of claim 9 comprising forming at least one of:
- a charge transport layer;
- a charge injection layer; and
- a charge blocking layer, wherein the at least one of the charge transport layer, charge injection layer and the charge blocking layer are arranged between the emissive layer and at least one of the first and second electrodes.

17. The method of claim 16, wherein a thickness of the at least one of: the charge transport layer, charge injection layer and the charge blocking layer is selected to allow for coupling of photons from the emissive layer to one or more surface plasmon polariton modes at the first electrode and/or for extraction of photons from the light emitting device.

18. The method of claim 9 comprising:
- forming a further emissive layer, the further emissive layer being configured to emit photons when a voltage is applied to the first and second electrodes, and wherein the emissive layer is configured to emit photons having a first wavelength and the further emissive layer is configured to emit photos having a second wavelength, the first wavelength being different from the second wavelength.

19. A method of forming a light emitting device, the method comprising:
- forming or providing a support layer;
- forming an antenna layer;
- forming a first electrode in proximity to the antenna layer;
- forming an emissive layer;
- forming a second electrode, wherein the antenna layer is arranged between the support layer and the second electrode, and wherein the emissive layer is arranged between the first and second electrodes and configured to emit light when a voltage is applied to the first and second electrodes, wherein the method further comprises forming at least one of:
- a charge transport layer;
- a charge injection layer; and
- a charge blocking layer, wherein the at least one of the charge transport layer, the charge injection layer and the charge blocking layer is arranged between the emissive layer and at least one of the first and second electrodes, wherein a thickness of the at least one of: the charge transport layer, the charge injection layer and the charge blocking layer is selected to allow for coupling of photons from the emissive layer to one or more surface plasmon polariton modes at the first electrode and/or for extraction of photons from the light emitting device; wherein the step of forming the antenna layer comprises:
  - providing a plurality of particles on the support layer so that a plurality of spaces are formed, each of the plurality of spaces being formed between at least two particles of the plurality of particles;
  - depositing a material so that at least a portion of the material passes through some or all of the plurality of spaces on to the support layer; and
  - removing the plurality of particles from the support layer, a plurality of portions of the material remaining on the support layer forming the antenna layer, and wherein the method further comprises:
- selecting one or more properties of the plurality of particles to adjust or control one or more parameters of the antenna layer, prior to providing the plurality of particles on the support layer.

* * * * *